(12) United States Patent
Traver et al.

(10) Patent No.: US 6,497,026 B1
(45) Date of Patent: Dec. 24, 2002

(54) SYSTEM AND METHOD FOR THE REMANUFACTURING OF A SEALED MODULE

(75) Inventors: Terry N. Traver, El Paso, TX (US); F. Ivan Castro, Cd Juarez (MX); Paul A. Ontiveros, Las Cruces, NM (US); Robert Fernandez, El Paso, TX (US); Jose L. Saad, Columbus, IN (US)

(73) Assignee: Cummins, Inc., Columbus, IN (US)

( * ) Notice: Subject to any disclaimer, the term of this patent is extended or adjusted under 35 U.S.C. 154(b) by 92 days.

(21) Appl. No.: 09/685,440

(22) Filed: Oct. 11, 2000

Related U.S. Application Data

(62) Division of application No. 09/298,224, filed on Apr. 23, 1999, now Pat. No. 6,192,570.

(51) Int. Cl.$^7$ ............................ B23P 6/00; B23P 19/00; B23B 51/00
(52) U.S. Cl. .................. 29/402.08; 29/762; 29/426.4; 29/426.5; 408/161
(58) Field of Search ............................ 29/402.08, 253, 29/244, 764, 758, 762, 426.4, 426.5; 83/870, 435.19; 408/161

(56) References Cited

U.S. PATENT DOCUMENTS

| | | |
|---|---|---|
| 4,556,439 A | 12/1985 | Bannink, Jr. |
| 5,119,547 A | 6/1992 | Ii |
| 5,216,803 A | 6/1993 | Nolan et al. |
| 5,265,328 A | 11/1993 | Gorman |
| 5,367,762 A * | 11/1994 | Disko et al. .................. 29/764 |
| 5,375,319 A | 12/1994 | Jacobs |
| 5,381,304 A | 1/1995 | Theroux et al. |
| 5,425,169 A | 6/1995 | Steinman et al. |
| 5,461,323 A | 10/1995 | Yanagi et al. |
| 5,477,009 A | 12/1995 | Brendecke et al. |
| 5,579,571 A | 12/1996 | Park et al. |
| 5,600,879 A | 2/1997 | Tsuchimoto et al. |
| 5,606,797 A | 3/1997 | Reynolds |
| 5,779,062 A | 7/1998 | Canonero |
| 5,790,651 A | 8/1998 | Suzuki et al. |
| 5,865,670 A | 2/1999 | Frank et al. |
| 6,038,909 A | 3/2000 | Zink |

* cited by examiner

*Primary Examiner*—Gregory M. Vidovich
*Assistant Examiner*—John C. Hong
(74) *Attorney, Agent, or Firm*—Barnes & Thonrburg

(57) ABSTRACT

A system and method is provided for opening a sealed engine control module in which the module includes a substrate bent around and sealed to a central housing. In one aspect of the invention, the housing is machined around its perimeter, without damaging the substrate, to expose the sealing bead. The sealing bead is disrupted by cutting a groove in the bead, in one embodiment. The modified module is placed within an opening fixture that supports the substrate against buckling or folding while the substrate is unbent about the housing. In another aspect of the invention, a handling support can be attached to the unbent substrate to prevent buckling or folding while the circuit board supported by the substrate is evaluated or modified, and while the substrate is being transported. A closing fixture is also contemplated that supports the substrate while applying a force to fold or close the substrate about a new housing.

8 Claims, 7 Drawing Sheets

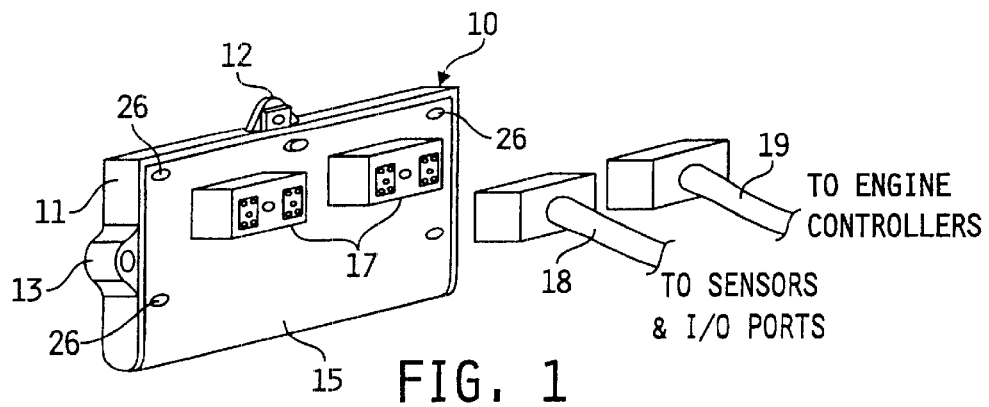
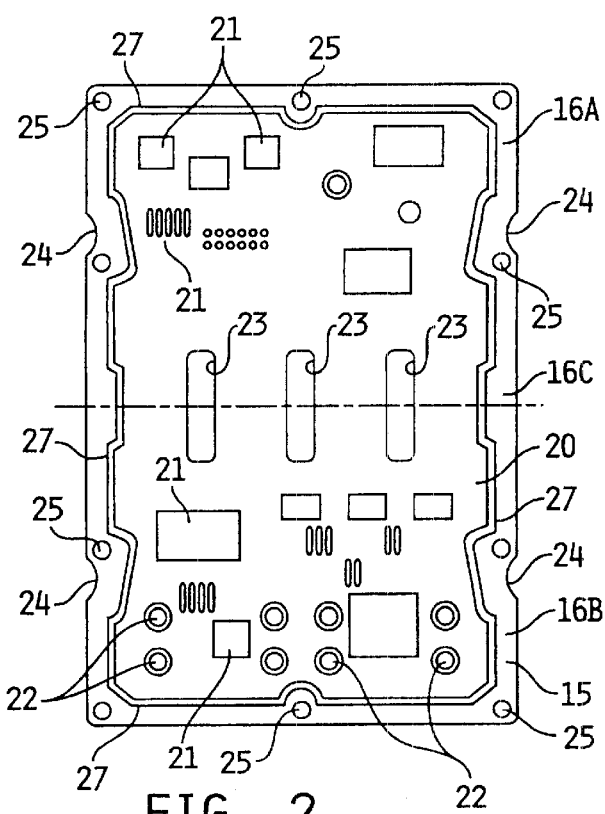
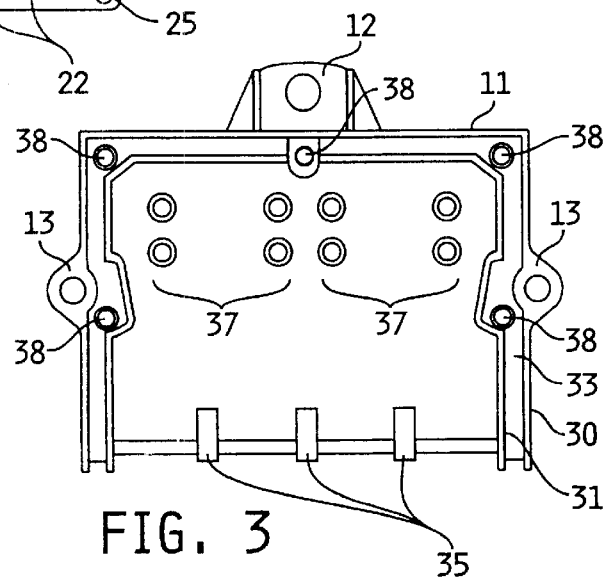

SYSTEM AND METHOD FOR THE REMANUFACTURING OF A SEALED MODULE

This application is a division of application Ser. No. 09/298,224, filed Apr. 23, 1999 now U.S. Pat. No. 6,192,570.

BACKGROUND OF THE INVENTION

The present invention concerns the remanufacture of electronic control modules, such as for use with electronically controlled engines. In particular, the invention concerns a system and method for opening a sealed module and resealing the module after servicing the internal components.

Most modern internal combustion engines have some form for electronic controller that governs the operation of the engine. In the case of larger vehicles, a substantial engine control module is provided that performs a wide range of functions. For example, the module provides signals via an electrical harness to various electrical components throughout the engine and vehicle. In addition, the module receives signals from a number of sensors disposed at various locations throughout the engine.

For example, as shown in FIG. 1, an engine control module (ECM) 10 includes a housing 11 with a top mounting boss 12 and side bosses 13 extending therefrom. The mounting bosses provide a means for mounting the ECM 10 within the vehicle or engine compartment. The ECM 10 includes a number of electrical components and microprocessors within the housing 11. A pair of connectors 17 are provided for engaging a pair of cables or harnesses 18, 19. These cables 18, 19 link the electronic and microprocessor components of the ECM 10 to the various sensors and engine control devices.

These electronic control or engine control modules utilize microelectronic components mounted on a substrate. In one type of ECM 10, a circuit board 20 is provided that includes a number of components 21 mounted thereon (see FIG. 2). In one particular approach, the circuit board 20 is formed of a flexible material, such as polyimide. The circuit board 20 is mounted to a rigidizer 15, which is formed of a relatively rigid substrate that is capable of withstanding the harsh environment of the engine. With this ECM, the rigidizer material has properties that allow the rigidizer to be folded or bent. In one example, the rigidizer is formed of aluminum.

One particular rigidizer 15 is shown in FIG. 2. The rigidizer 15 includes a top plate 16A, a bottom plate 16B and an integral intermediate bend region 16C between the two plates. The bottom plate 16B defines a number of connecting holes 22, which receives a number of screws therethrough for attaching the connectors 17 to the outside surface of the bottom plate. A number of slots 23 are formed at the bend region 16C of the circuit board 20 as a bend relief feature and to accommodate a hinge support component of the housing 11, as described herein. The rigidizer 15 also defines certain features for retaining and supporting circuit board 20. For example, the rigidizer defines a sealing or alignment rim 27 around the perimeter of the top plate 16A and bottom plate 16B. The outer perimeter of the circuit board 20 follows the contour of the sealing rim 27. Preferably, the circuit board 20 is engaged to the rigidizer 15 with a compatible adhesive. The sealing rim 27 is offset from the edges of the rigidizer 15 for reasons made clear herein. The rigidizer 15 also defines a plurality of housing mounting holes 25 that are used to receive a like number of screws 26 (FIG. 1) for closing the rigidizer 15 about the housing 11 to form the sealed module 10. A number of mounting boss reliefs 24 can also be defined around the edge of the rigidizer 15 to correspond to the location of the side mounting bosses 13 of the housing 11.

Details of the housing 11 are shown in FIG. 3. Like the rigidizer 15, the housing is preferably formed of a rigid metal, such as aluminum. The housing 11 is generally sized to correspond to half of the rigidizer 15, since the housing is disposed between the top plate 16A and bottom plate 16B. Thus, the features depicted in FIG. 3 appear on both sides of the housing 11. For example, the housing includes an outer rim 30 that follows the outer perimeter of the housing. An inner rim 31 is also formed in the housing offset inward from the outer rim. The inner rim 31 corresponds to the configuration to the sealing rim 27 defined on rigidizer 15.

The housing 11 defines a number of connector holes 37 that align with the corresponding mounting holes 22 in the circuit board 20 and rigidizer 15. A number of mounting holes 38 pass through the housing 11 and are aligned with the housing mounting holes 25 to receive the screws 26. The housing 11 also includes a number of hinge supports 35 that are aligned with the slots 23 formed in the circuit board 20. These hinge supports 35 are preferably rounded and provide a surface about which the bend portion 16C of the rigidizer 15 is folded.

As shown in FIG. 4, the housing 11 is sandwiched between the top plate 16A and the bottom plate 16B of the rigidizer 15. A number of connector mounting screws 39 pass through the mounting holes 37 in the housing 11 and the holes 22 in the bottom plate 16B to engage the connectors 17. In the construction of this module 10, the rigidizer 15 is bent around the housing 11. The rigidizer 15 is configured to essentially sit within the outer rim 30 of the housing, as shown most clearly in FIG. 5. When the rigidizer 15 is bent around the housing 11, the various rims, namely the sealing rim 27 of the rigidizer 15, and the outer and inner rims 30, 31 of the housing 11, define a bead groove 33 that travels around three sides of the perimeter of the module 10. The bead groove 33 need not extend to the bend region 16C of the rigidizer 15, since that side or edge of the module 10 is already closed. Before the top plate 16A and bottom plate 16B of the rigidizer 15 are bent to their final position, an adhesive or sealant bead 40 is applied along the bead groove 33. This sealant bonds the rigidizer 15 to the housing 11. Preferably, the bead material is capable of bonding metal-to-metal, while withstanding the high temperatures experienced in the engine compartment. In one embodiment, the bead is an RTV material.

While the ECM 10 depicted in FIGS. 1–5 provides an environmentally sound and sealed module, difficulties arise when the module must be remanufactured. This remanufacturing process may be required when there is an update to some of the components 21 mounted on the circuit board 20. In other instances, direct diagnosis of the components is necessary, necessitating access to the circuit board 20. In the absence of remanufacturing, the ECM 10 is simply disposed of or scavanged, and replaced with a new module. Of course, this approach unnecessarily wastes resources and can lead to delays where the module is difficult to obtain.

Consequently, there is a need for a system and method that permits the remanufacture of modules, such as the ECM 10 described above. The system and method must be capable of opening the module without disturbing or compromising the rigidizer 15, or the circuit board 20 and its components.

SUMMARY OF THE INVENTION

In order to address these needs, the present invention contemplates a system and method for opening a sealed module for remanufacture. In one aspect of the invention, the housing is machined at its perimeter to expose a sealing bead. The machining operation is precisely controlled to prevent any. impingement on the rigidizer or the circuit board mounted on the rigidizer. Instead, only the housing is machined to provide access to the bead groove. In a next step of the method, the sealing bead is disrupted substantially around the perimeter of the module. In one embodiment, a slot saw is operated along the entire perimeter at the bead groove to cut a channel or slot along the sealing bead at both the top and bottom plates of the rigidizer. In another embodiment, an array of wedges is driven into the bead groove.

Once the sealing bead has been disrupted or weakened, the top plate and bottom plate can be unbent relative to each other. In one aspect of the invention, a bending brake device is modified for opening the sealed module. In the preferred embodiment, the outer perimeter of both the top plate and the bottom plate of the rigidizer are fully supported in order to maintain the integrity of the rigidifier and circuit board mounted thereon. Consequently in a further aspect of the invention, a system is provided in which an opening fixture is used to support the plates of the rigidizer while facilitating the unbending operation. The opening fixture can include a fixed base portion having a flange configured to fit within the slot cut into the sealing bead at the bottom plate. The flange extends substantially around the perimeter of the sealing bead groove.

The fixture can also include a moveable or pivotable upper rigid support that also includes a flange configured to engage the slot formed in the sealing bead between the top plate and the housing. The upper perimeter support is hingidly mounted to the base or lower perimeter support so that the upper support can essentially pivot about the bend region of the rigidizer. The fixture can include a pair of moveable stops that are moveable from one position clear of the lower perimeter support to allow insertion of the module into the opening fixture and a second position in which the stops block or prevent expulsion of the module from the opening fixture during the unbending process.

In one embodiment, the opening fixture is manually operated. With this approach, the upper perimeter support provides adequate surface for grasping and pivoting about the hinge mount to unbend the rigidizer at the bend region. In an alternative embodiment, the opening fixture is powered. In this feature, the upper perimeter support includes a lever arm that is connected to a drive mechanism or power device. For instance, the drive mechanism can constitute a pneumatic or air cylinder in which the cylinder piston is connected to the lever arm. Reciprocation of the piston causes the lever arm to pivot about the hinge mount, which thereby causes the upper perimeter support to pivot about the hinge.

With either opening fixture, the bottom plate is held generally rigid and unmovable while a force is applied to the top plate to unbend the rigidizer about the bend region. Using this fixture, the integrity of the rigidifier is maintained, not only in the top and bottom plates, but also at the bend region. A controlled force can be applied, either manually or automatically, to the upper perimeter support to gradually open the module. Preferably, at this point, the integrity of the sealing bead has been sufficient disrupted by the machined slot so that the bead itself offers little resistance to the separation of the rigidizer from the housing.

In a preferred embodiment, the top plate is unbent so that the top plate forms approximately a ninety-degree angle relative to the bottom plate. At this point, the housing can be removed by removing any fasteners that may be holding the housing to the bottom plate of the rigidizer. The housing can be discarded, since it has been significantly machined. With the housing removed, the perimeter of the rigidizer adjacent the sealing rim can be cleaned of any residual sealing bead material.

With the module thus opened, the components of the circuit board can be modified, replaced and/or tested. The rigidizer and circuit board are now ready to receive a new housing. In a further feature of the invention, a handling support is provided to preserve the integrity of the rigidizer, and particularly the top and bottom plates, when the unbent or open rigidizer is removed from the opening fixture. In one embodiment, the handling support includes an upper bar and lower bar connected at a substantially right angle joint. Each of the bars defines a groove to receive a side edge of one of the plates of the rigidizer. Each of the bars includes an opening to receive a fastener therethrough, which fastener is. aligned with one or more of the external fastener openings defined in the rigidizer. This handling support is thus connected to the rigidizer to maintain the top and bottom plate in their ninety-degree orientation, and to preserve the structural integrity of the rigidizer and circuit board mounted thereon.

Once the work on the circuit board has been completed, the rigidizer is carried by the handling supports to a closing fixture. The handling supports can then be removed and the rigidizer mounted within the fixture. In one embodiment of the invention, the rigidizer is oriented so that its top and bottom plates form a forty-five degree angle relative to the horizontal. The new housing can then be inserted into the space between the top and bottom plates and fastened to the appropriate plate. A new sealing or joint bead can be applied to both the top and bottom plates around their perimeter adjacent the sealing rim. The closing fixtures can be operated to push the top and bottom plates toward each other, thereby bending the rigidizer at the bend portion with the housing sandwiched between the two plates. The closing fixture can be held in position with the rigidizer clamped about the housing for sufficient period of time to allow the sealing or joint bead to cure. Upon completion of this step, a new remanufactured control module is available for mounting within a particular vehicle.

It is one object of the present invention to provide a system and method for the remanufacture of the sealed electronic modules. A further object of the invention is achieved by features that maintain the integrity of the circuit components of the module, while minimizing the number of module components that must be replaced.

The present invention provides a significant benefit to systems employing a sealed module since the modules no longer need to be discarded when errors arise or system updates are required. A further benefit is that the remanufacture process does not require any complicated machines or fixtures, which means that remanufacturing stations can be readily and cheaply provided for a mass remanufacture of sealed control modules.

These and other objects and benefits, will become apparent upon consideration of the following written description and accompanying figures.

DESCRIPTION OF THE FIGURES

FIG. 1 is a side perspective view of an engine control module and its connection to various components of the vehicle.

FIG. 2 is a top elevational view of a rigidizer that forms one component of the engine control module depicted in FIG. 1.

FIG. 3 is a top elevational view of a housing that is sandwiched between the portions of the rigidizer shown in FIG. 2, to form the control module illustrated in FIG. 1.

DESCRIPTION OF THE PREFERRED EMBODIMENTS

Figure 4:
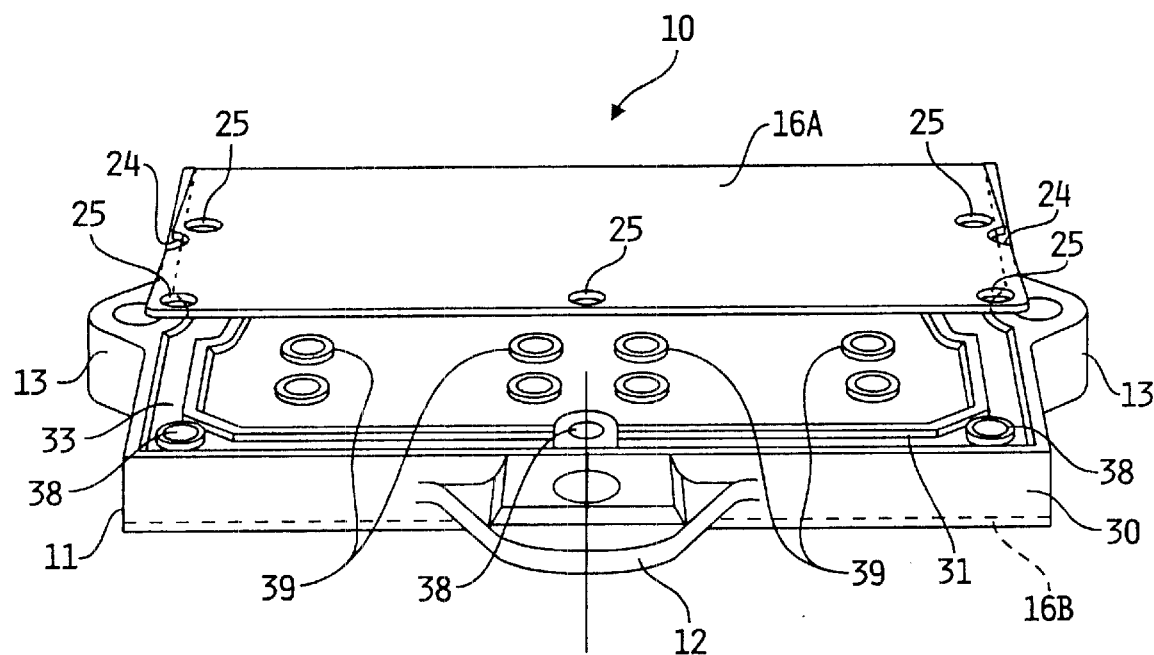
FIG. 4 is a front perspective view of the engine control module shown in FIG. 1 prior to final closing of the module.

For the purposes of promoting an understanding of the principles of the invention, reference will now be made to preferred embodiments illustrated in the drawings and specific language will be used to describe the same. It will nevertheless be understood that no limitation of the scope of the invention is thereby intended, such alterations and further modifications in the illustrated embodiments, and such further applications of the principles of the invention as illustrated therein being contemplated as would normally occur to one skilled in the art to which the invention relates.

Figure 6A:
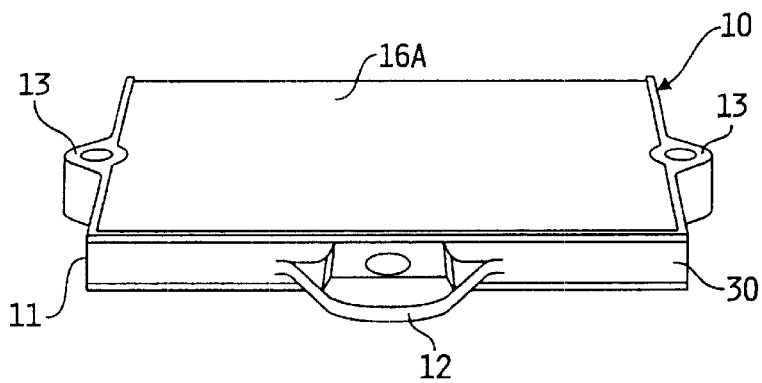
FIGS. 6A–6C are front perspective views of an engine control module at three stages of the inventive process for opening the module.

In one aspect of the invention, a sealed module, such as the sealed module shown in FIG. 6A, is manipulated to permit removal of the housing 11. As shown in FIG. 6A, the outer rim 30 of the housing 11 essentially protects the edges of the top plate 16A and bottom plate 16B (not shown). With the particular ECM 10 shown in this figure, the housing includes a pair of side mounting bosses 13 and a top mounting boss 12 that are configured to receive mounting bolts to support the module within the engine compartment In the next step of the invention, the housing is machined to remove the external features at the perimeter of the housing. More specifically, the housing 11 is machined to remove the outer rim 30, side mounting bosses 13 and top mounting boss 12. The purpose of this machining step is to expose the side edge around the perimeter of the rigidizer 15, as well as the sealing bead disposed between the top plate 16A and the housing 11, and the bottom plate 16B and the housing. Preferably, this machining step is performed using a mill machine. Most preferably, a numerically controlled milling machine is utilized to provide precision cutting of the housing without affecting the rigidizer 15. It should be understood that the milling operation only occurs on three sides of the module 10' shown FIG. 6B. The back side of the module 10' is closed by the bend region 16C of the rigidizer 15. Since the goal is to maintain the integrity of the rigidizer, no machining operation occurs on that back side.

Figure 5:
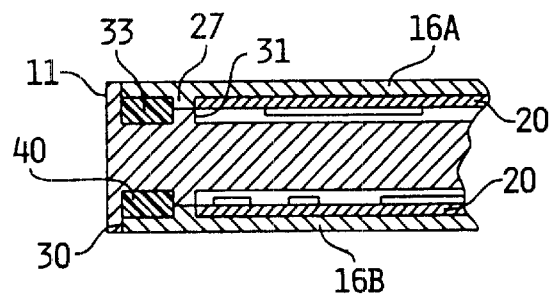
FIG. 5 is a cross sectional view through one side of the engine control module as depicted in FIGS. 1 and 4.
Figure 6B:
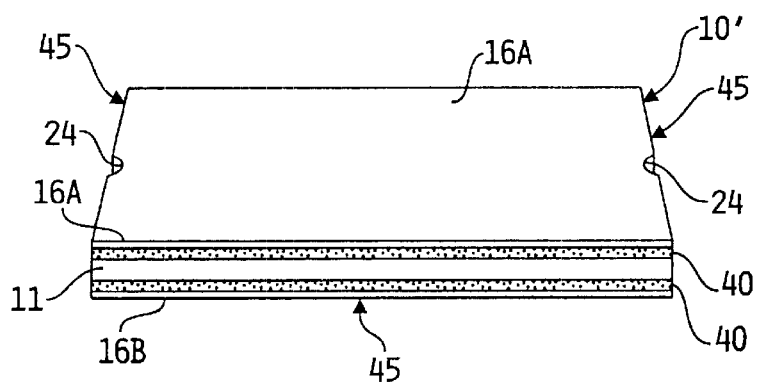
Figure 6C:
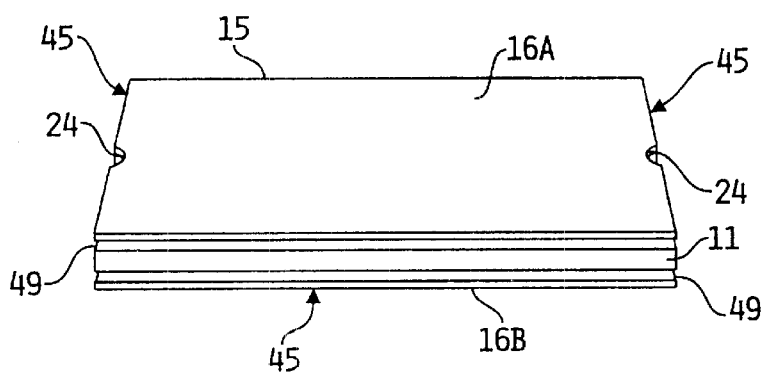

In the next step of the procedure depicted in FIG. 6C, the sealing bead 40 that runs along the perimeter between the top plate and the house and the bottom plate and the housing, are both disrupted. In the preferred embodiment, these two beads are disrupted by using a slot saw to cut a slot or groove 49 along the bead material and between the rigidizer 15 and housing 11. Preferably the slot saw has a width substantially equal to the distance between the top plate 16A and the housing 11, for instance. The slot saw can have a width and depth that correspondence to the width and depth dimensions of the bead groove 33 (see FIG. 5) between the two plates of the rigidizer and the housing. Again, the slot saw-can be numerically controlled to assure a precision cut that does not damage the rigidizer 15 or the circuit board 20 mounted on the rigidizer. The object of this step is to substantially disrupt the sealing bead 40 to facilitate unbending of the rigidizer 15.

Figure 6D:
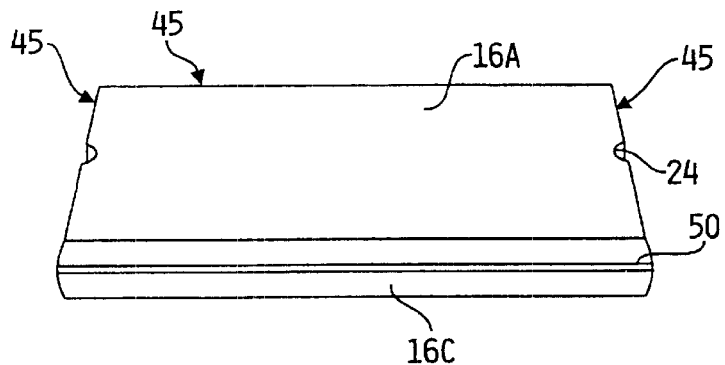
FIG. 6D is a rear perspective view of the module machined as in the previous steps, with the results of an additional step in the process.

In certain embodiments of the inventive method, the thickness of the rigidizer 15 may make the unbending process more difficult, or at least require a greater amount of force than for a thinner plate. Thus, in these embodiments an additional groove 50 is defined at the bend region 16C of the rigidizer 15 as shown in FIG. 6D. This groove 50 acts as a sort of hinge relief as force is applied to the top plate 16A. In this instance, this force will cause the top plate 16A to essentially pivot about the hinge groove 50. It is understood that the hinge groove 50 must not pass completely through the thickness of the rigidizer 15. Preferably, the groove has a depth of about one quarter of the thickness of the rigidizer 15 at the bend region 16C. This interruption in the rigidizer surface will lead to a measurable reduction in the amount of force necessary to unbend the top plate 16A relative to the bottom plate 16B.

Figure 7:
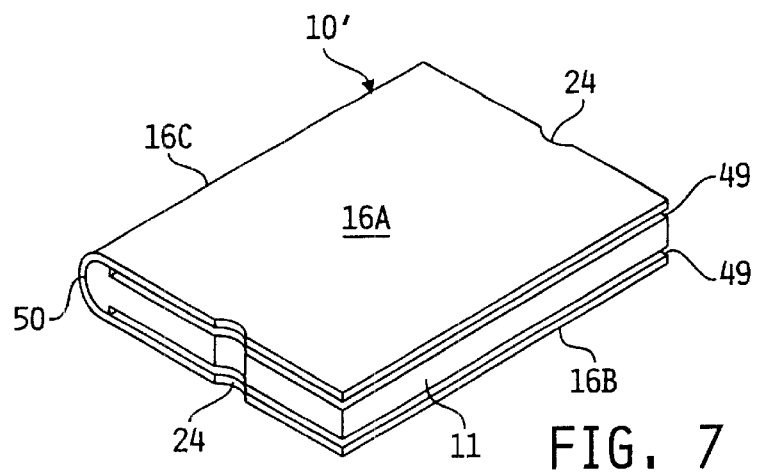
FIG. 7 is a perspective view of the sealed module after completion of the sequence of steps depicted in FIGS. 6A–6D.

Following completion of the process steps shown in FIGS. 6B–6D, the modified ECM 10' appears as shown in FIG. 7. In the illustrated embodiment, the rigidizer 15 includes relief notches 24 defined in the side of the top and bottom plates to accommodate the side mounting bosses 13 and the housing 11.

In the machining step as illustrated in FIG. 6B, these mounting bosses are also removed, leaving the relief notches 24 of the rigidizer 15 exposed as shown in FIG. 7.

Figure 8:
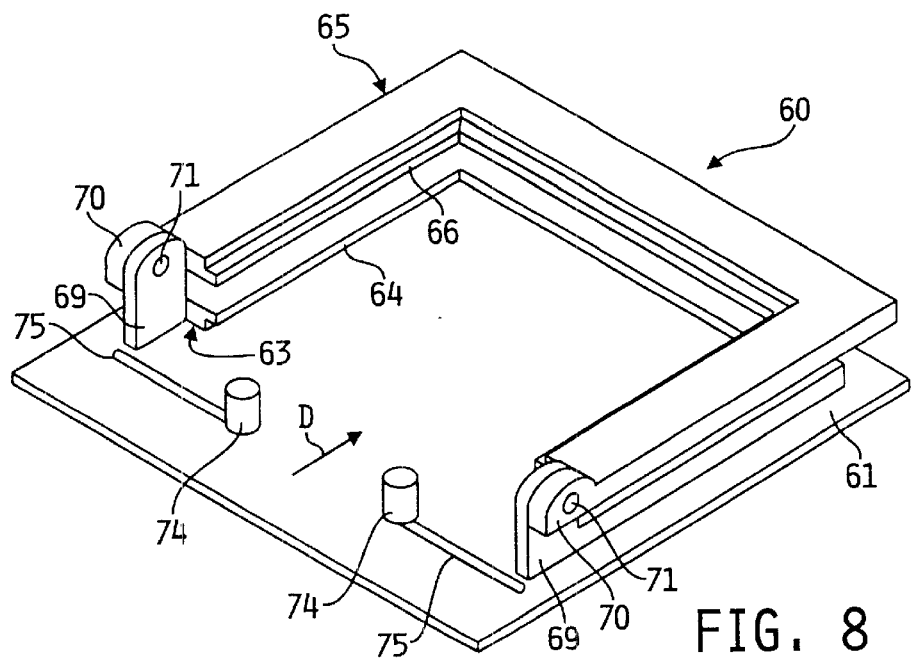
FIG. 8 is a rear top perspective view of an opening fixture in accordance with one aspect of the present invention.
Figure 9:
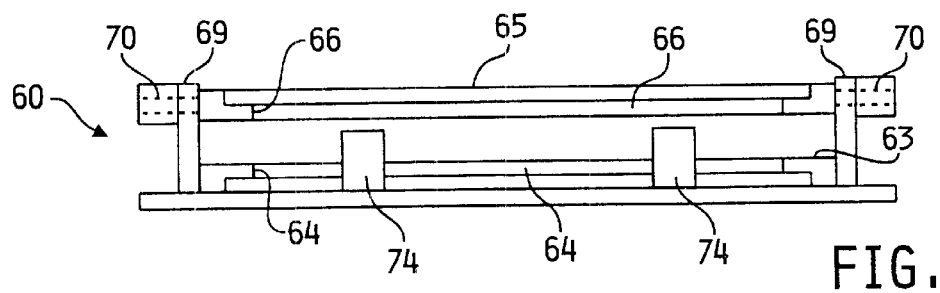
FIG. 9 is a side elevational view of the opening fixture shown in FIG. 8.
Figure 10:
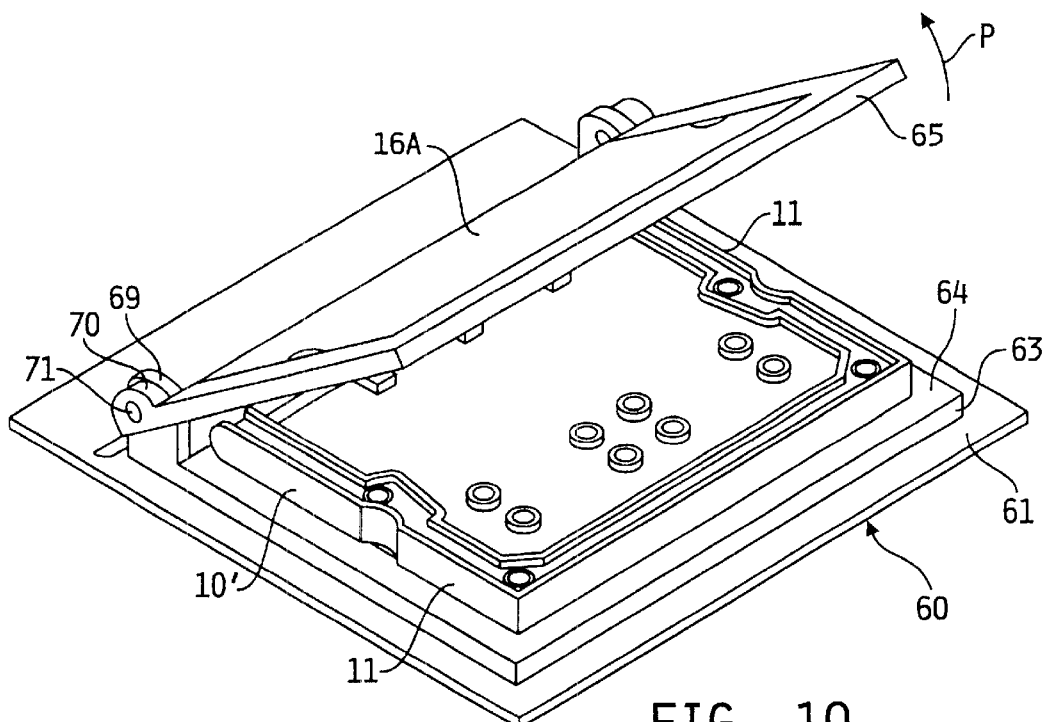
FIG. 10 is front perspective view of the opening fixture depicted in FIGS. 8 and 9 with a control mounted within the fixture.

The module 10' can then be placed within an opening fixture, such as the fixture 60 as shown in FIGS. 8–10. The primary function of the fixture 60 is to provide substantial support for the rigidizer 15 while allowing the rigidizer to be pivoted or unbent about the bend region 16C. It is important that the integrity of the rigidizer 15 be maintained throughout the unbending process to ensure that the top and bottom plates 16A, 16B do not bow or flex. While the rigidizer itself can easily withstand this deflection, the circuit board 20, as well as the components and solder joints present on the board, cannot withstand any degree of bowing of flexing. With this in mind, the opening fixture 60 includes a base 61 onto which mounted a lower perimeter support 63. The lower perimeter support 63 defines a flange 64 around three sides of its perimeter. The flange 64 has a thickness and a depth that are substantially equal to the thickness and depth of the bead groove 33 defined between the top and bottom plates and the rigidizer. In other words, the flange 64 is sized to fully support the perimeter of the rigidizer 15 directly adjacent the sealing rim 27 (see FIG. 2).

The opening fixture 60 also includes an upper perimeter support 65 that also includes a similarly configured flange 66. As with the lower perimeter support, the upper perimeter support and flange 66 are configured so that the rigidizer 15 is fully supported directly adjacent the sealing rim 27.

The upper perimeter support 65 is mounted to the base 61 or lower perimeter support 63 by way of a hinge mounting portion 69. In one embodiment, the upper perimeter support can include a pivot boss 70 that is engaged to the hinge mount portion 69 of the lower perimeter support by way of a hinge pin 71. Thus, the upper perimeter support 65 is mounted for rotation or pivoting relative to the fixed lower perimeter support 63.

The opening fixture 60 is configured so that the ECM module 10' can be inserted in the direction of the arrow D. When the module is disposed within the fixture, some means are necessary for preventing the module from backing out of the fixture when the bending force is being applied by way of the upper perimeter support 65. Thus, in one embodiment, a pair of stops 74 are included that are arranged to contact the rigidizer 15 at the bend region 16C. Preferably the stops 74 are adjustable so that they can be moved from a position blocking the opening to the fixture 60 as shown in FIG. 8, to a position in which the stops 74 are clear of the opening to allow insertion of a sealed module. In one specific embodiment, the stops 74 can be slidingly mounted within a corresponding adjustment slot 75. A variety of configurations for the adjustment slot can be provided other than having the having the stops 74 move transversely across the opening of the fixture 60. For example, the slots can be orientated in the direction of the arrow D, or at any angle therebetween. Preferably the stops 74 are of a known construction that allows the stops to be loosened relative to the slot when it is desired to move the stops and then retightened to fix the position of the stops relative to the slots 75.

The positioning of a module 10' within the opening fixture 60 is depicted in FIG. 10. As shown in the figure, the module 10' is slid into the opening fixture 60 with the top plate 16A being supported by the upper perimeter support 65. The bottom plate is not seen in the figure but is situated under the lower perimeter support 63. In the instance in which the module 10' includes connectors projecting below the bottom plate 16B, as illustrated in FIG. 1, the lower perimeter support 63 can be offset relative to the base 61 to provide space for receiving the connectors. With the module 10' thus mounted within the opening fixture 60, a force P can be applied to the upper perimeter 65 to rotate the upper support 65 relative the fixed lower support 63. As this rotation continues, the top plate 16A of the rigidizer 15 gradually unbends or pivots relative to the lower plate and ultimately relative to the housing 11.

In the preferred embodiment, the upper perimeter support 65 is rotated until the top plate 16A forms a substantially ninety degree angle relative to the bottom plate 16B. In this orientation, the housing 11, and most particularly the connector mounting screws 39, are cleanly exposed. The housing 11 can be removed from the module 10' by removing the mounting screws 39, as well as any other fasteners that might be used to fix the housing 11 to the bottom plate 16B. Once the housing 11 has been removed, the circuit board 20 mounted to the rigidizer 15 will be fully exposed to allow the repair, replacement, or testing of the components mounted on the circuit board.

In the embodiment illustrated in FIG. 10, the force P is manually applied. The amount of manual force that needs to be applied to unbend the rigidizer 15 depends upon the thickness of the rigidizer and the lever arm provided by the upper perimeter support 65. The upper support can be modified to include manually engageable features projecting outward to the support to improve the pivoting fulcrum.

Figure 11:
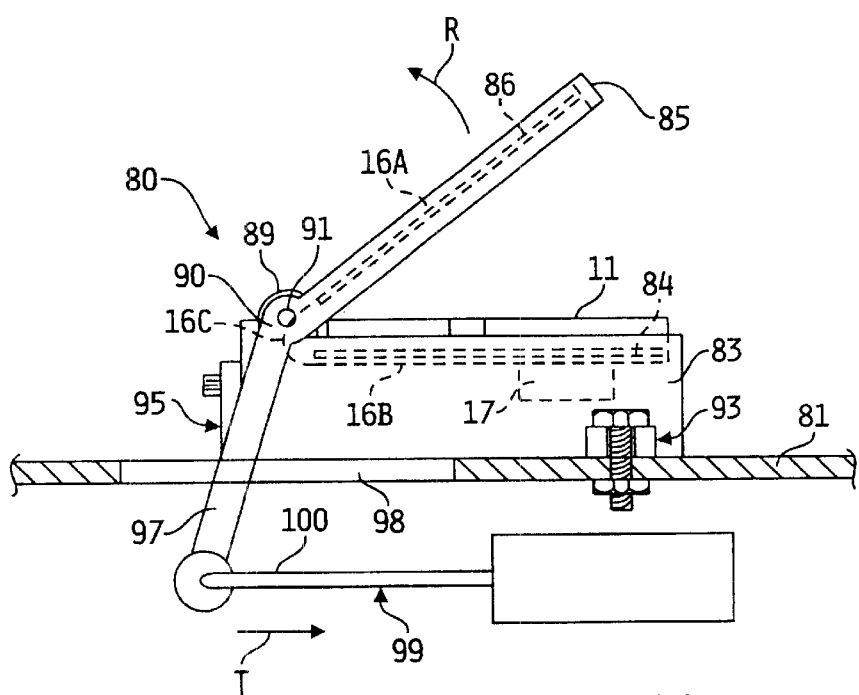
FIG. 11 is a side elevational view of an alternative embodiment of an opening fixture in accordance with the present invention in which the fixture is powdered.

In an alternative embodiment, the opening process is automated or powered. In this embodiment, an opening fixture 80 as shown in FIG. 11 includes a base 81, a lower perimeter support 83 and an upper perimeter support 85. The perimeter supports 83 and 85 each include a respective flange 84 and 86, and are otherwise configured similar to the supports 63 and 65 as shown in FIG. 8. As shown in FIG. 11, the lower perimeter support 83 is elevated to provide clearance for receiving the connectors 17. The lower perimeter support 83 can be fixed to the base 81 by way of a mounting assembly 93. The mounting assembly can consist of a bolt and flange arrangement, or other known means for fixedly mounting the support 83.

As with the previous embodiment, the upper perimeter support 85 is pivotally mounted relative to the lower support. Thus, the lower support can include a hinge mounting portion 89 and the upper support 85 can include a pivot boss 90. A hinge pin 91 can pivotably connect the two supports. In addition, as with the previous embodiment, the opening fixture 80 includes a stop assembly 95 that is arranged to prevent the module from backing out as the unbending force is being applied to the rigidizer 15.

In contrast to the opening fixture 60, the opening fixture 80 includes a lever arm 97 that extends outwardly from the upper perimeter support 85. In the preferred embodiment, the lever arm 97 extends downwardly through a slot 98 defined in the base 81. A drive mechanism 99 is supported underneath the base 81 and is connected to the lever arm 97. The movement of the drive mechanism 99 in the direction of the arrow T produces a rotation of the support 85 in the direction of the arrow R.

Using this drive mechanism, manual manipulation or unbending of the rigidizer is not required. This drive mechanism 99 can take a variety of forms, such as a pneumatic or hydraulic cylinder with a reciprocating drive shaft 100. Alternative powered drive mechanisms are contemplated that are capable of rotating the upper perimeter support 85 relative to the hinge mount 89. For instance, an electric motor, a rack and pinion arrangement, a cam mechanism, or other drive mechanisms are contemplated. Moreover, while the most preferred embodiment utilizes a lever arm 97, the drive mechanism can be mounted to the upper perimeter support 85 or pivot boss 90. The important feature to be retained is the ability to provide a controlled unbending force to the upper perimeter support 85, and consequently the rigidizer 15 mounted within the opening fixture 80. Preferably, the drive mechanism 99 includes an apparatus for controlling the operation of the mechanism so that the drive mechanism 99 stops when the top plate 16A has reached a preferred angle relative to the fixed bottom plate 16B.

Figure 12:
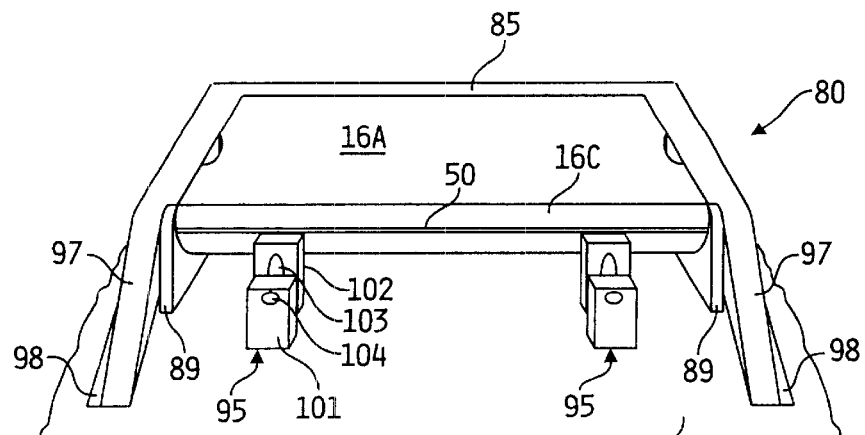
FIG. 12 is a rear perspective view of the opening fixture shown in FIG. 11 particularly showing stops for supporting the bend region of the sealed module.

Referred to FIG. 12, details of the stop assemblies 95 are shown. In particular, the stop assembly can include a stop mount 101 that is fixed to the base 81. Preferably, the stop mount has a height that is sufficiently low to provide clearance for inserting the module into the opening fixture 80. Each stop assembly can also include a moveable stop 102 that defines a slot 103. A clamping screw 104 extends through the stop mount 101 and the slot 103. Loosening the clamping screw 104 allows the moveable stop 104 to be translated upward into contact with the bend region 16C of the rigidizer 15. Once the moveable stop is in position, the clamping screws can be tightened to firmly support the module within the opening fixture. Preferably the moveable stop 102 is positioned so that it does not traverse the hinge groove 50 or otherwise impede the unbending of the top plate 16A about the bend region 16C.

Figure 13:
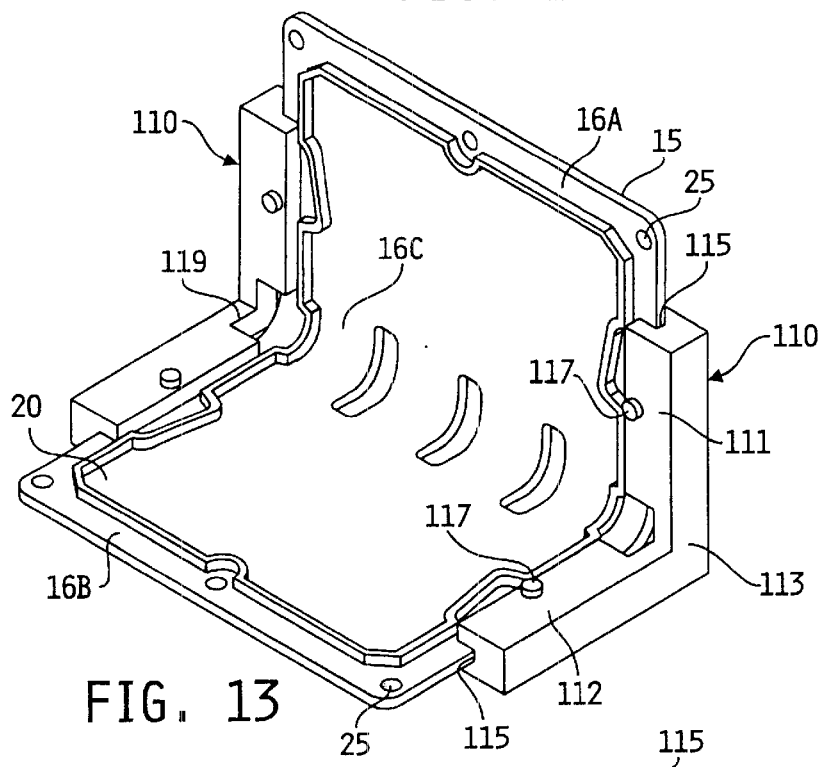
FIG. 13 is a front perspective view of a rigidizer after it has been unbent and the housing removed, with the rigidizer being maintained by a pair of handling supports.
Figure 14:
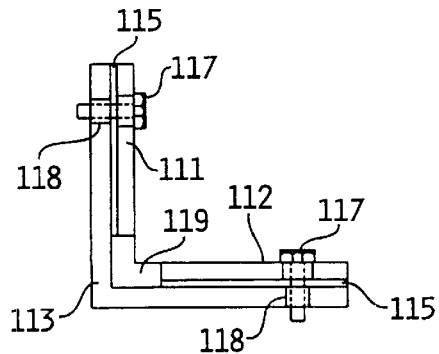
FIG. 14 is a side elevational view of one of the handling supports depicted in FIG. 13.

As previously indicated, the rigidizer 15 is preferably unbent or opened so that the top plate 16A forms a substantially ninety degree angle relative to the bottom plate 16B, as shown in FIG. 13. In this configuration, the housing can be easily removed and access is readily provided to the circuit board 20 mounted on the rigidizer. Just as during the unbending process, it is essential that the rigidizer 15 not bend or flex during the remanufacture process, to avoid placing stress to the circuit board 20 and its mounted components. Thus, in a further feature of the invention, a pair of handling supports 110 are provided to maintain the rigidizer 15 in its unbent orientation. In the preferred embodiment, the handling support 110 includes an upper bar 111 and a lower bar 112 integrally formed with a right angle joint 113. The upper and lower bars 111, 112 define a rigidizer groove 115 therein. The groove is sized to receive one of the plates of the rigidizer 15 therein. A number of attachment screws extend through bores 118 in the upper bar 111 and lower bar 112. The attachment screws 117 are aligned with openings already formed in the rigidizer 15, such as the housing mounting holes 25. Preferably, one end of the bores 118 passing through each of the bars 111, 112 is threaded so that attachment screws 117 can be directly threaded to and fixed within the handling support 110. The handling supports also include a bend relief 119 defined at the right angle joint 113 to accommodate the bend region 16C of the rigidizer 15.

Figure 15:
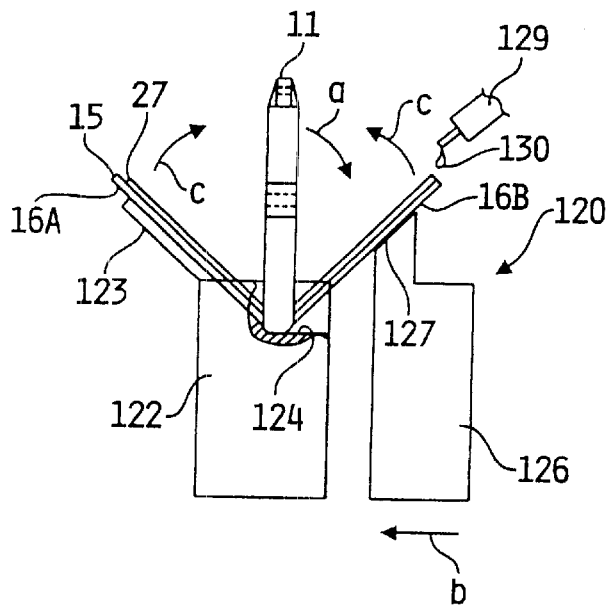
FIG. 15 is a side elevational view of the opened or unbent rigidizer mounted within a closing fixture in anticipation of inserting a new housing and a new sealing bead prior to closing.

While the rigidizer and the circuit board are supported by the handling support 110, the technician can perform whatever repairs, replacements or diagnostics as may be necessary to the module circuitry. The handling support 110 can then be used to transport the opened rigidizer to a closing fixture such as a closing fixture 120 shown in FIG. 15. At the closing fixture, a new ECM is created by adding a housing 11 to the opened rigidizer 15. In one embodiment, the closing fixture includes a fixed mount 122 that supports the opened rigidizer. Preferably the fixed mount includes a moveable support plate 123 arranged to initially support the top plate 16A of the opened rigidizer 15 at a substantially forty-five degree angle relative to the horizontal. The fixed mount 122 also includes a support recess 124 within which the bend region 16C of the rigidizer rests. A second component of the closing fixture 120 is the moveable support 126. The moveable support 126 includes a support surface 127 that is arranged to support the bottom plate 16B of the rigidizer, again at a substantially forty-five degree angle relative to the horizontal. The moveable support 126 is configured or powered to move in the direction of the arrow d.

As in the operation of the closing fixture 120, a housing 11 can be placed between the two plates of the rigidizer 15. At some point in the process, a joint dispensing nozzle 129 is used to apply a joint bead 130 along the exposed perimeter of the top and bottom plates 16A, 16B. This joint or sealing bead can be the RTV bead or any suitable metal-to-metal adhesive. Once the joint bead has been applied, the housing 11 can be rotated in the direction of the arrow a and fastened to the lower plate 16B as described above.

The two halves or plates 16A, 16B or the rigidizer 15 are pushed together by movement of the moveable support 126. In addition, the support plate 123 is preferably pivotably connected to the fixed mount 122 so that both the top plate 16A and bottom plate 16B can move toward each other in the direction of the arrow c. The support plate 123 can be separately powered or can be connected to the moveable support 126 by way of a linkage so that translation of the moveable support 126 also leads to pivoting of the support plate 123. The movement of the moveable support 126 can be calibrated so that it stops when the rigidizer 15 is firmly joined with the housing 11. The newly closed module can then be held within the closing fixture 120 for a period of time to allow the sealing bead to cure. After the bead has had time to cure, the newly remanufactured sealed module can be removed from the fixture 120 and installed in a vehicle.

In the preferred embodiment of the invention, the sealing bead is weakened or disrupted in a machining process, as depicted in FIG. 6C. In an alternative embodiment, the bead can be disrupted using a series of wedges, as employed by the opening fixture 140 shown in FIG. 16. The fixture 140 can include a pair of side walls 142 a front wall 143 and a rear wall 144. Each of the walls are preferably fixedly mounted to a base. In accordance with this embodiment, a set of wedges 146 are arranged in alignment with the sealing bead 40 between the top plate 16A and rigidizer 15 and between the bottom plate 16B and the housing 11. The wedges are preferably attached to a pushing block 147. A lead screw 148 is connected to the pushing block 147 and is threaded through an opening 149 within the side walls 142 and front wall 143.

Figure 16:
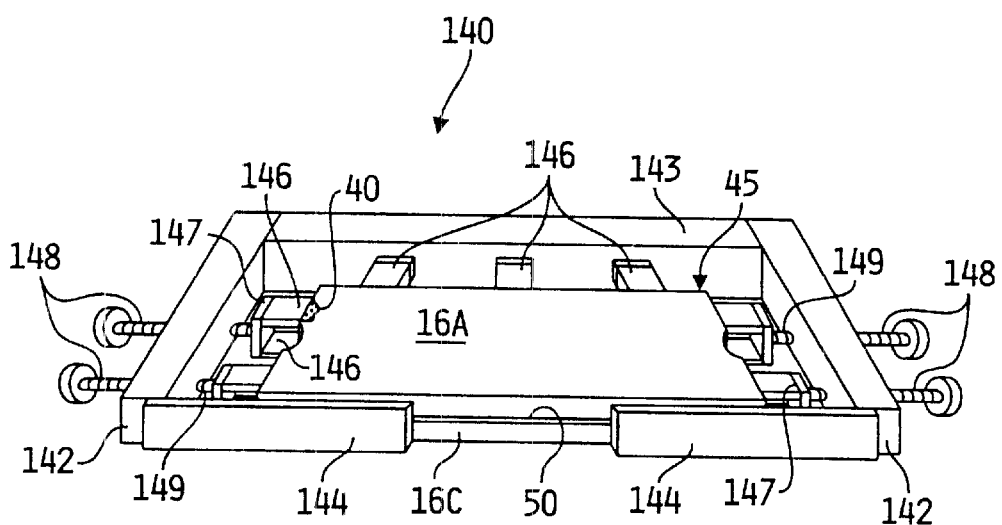
FIG. 16 is a front perspective view of an alternative embodiment of the invention in which an arrangement of wedges are used disrupt the sealing beads around the perimeter of the rigidizer and housing.

As shown in FIG. 16, two lead screws 148 are arranged in the side walls, while three lead screws are situated in the front wall. The wedges are configured to penetrate the sealing bead 40, so that they are preferably beveled at their leading edges. Rotation of the lead screws 148 moves each pushing block 147 toward the sealed module. Further rotation of the lead screws pushes each of the wedges 146 into the sealing bead 40, thereby disrupting the bead. As shown in FIG. 16, the lead screws 148 are configured to be manually rotated. However, the screws can be simultaneously driven by a series of rotary motors.

While the invention has been illustrated and described in detail in the foregoing drawings and description, the same is to be considered as illustrative and not restrictive in character, it being understood that only one preferred embodiment there of has been shown and described an that all changes and modifications that come within the spirit of the invention are desired to be protected. For example, the opening fixture 60 can constitute a known bending brake that is modified to engage the rigidizer. In addition, the opening fixture can be modified to provide limited perimeter support of the top plate 16A and bottom plate 16B when the substrate 15 is sufficiently rigid to avoid warping during the opening process.

What is claimed is:

1. A fixture for opening a sealed module having a housing and a substrate carrying a circuit board thereon and folded around the housing with a top plate adjacent a top face of the housing and a bottom plate adjacent a bottom face of the housing and a bend portion therebetween at one side of the housing, the module having an upper sealing bead between the top plate and the housing and a lower sealing bead between the bottom plate and the housing, the fixture comprising:

a fixed wall facing a portion of the perimeter of the module;

a pushing block;

a drive mechanism connected between said fixed wall and said pushing block and operable to translate said pushing block away from said fixed wall toward the perimeter of the module;

a first wedge mounted on said pushing block and aligned to penetrate the upper sealing bead as the pushing block is translated toward the module; and a second wedge mounted on said pushing block and aligned to penetrate the lower sealing bead as the pushing block is translated toward the module.

2. The fixture for opening a sealed module according to claim 1 wherein said drive mechanism includes a lead screw coupled to said pushing block and threadedly engaged through said wall.

3. The fixture for opening a sealed module according to claim 1 further including a number of said pushing blocks and associated drive mechanisms positioned about the portion of the perimeter of the module.

4. The fixture for opening a sealed module according to claim 1 wherein the module has a front, a back and opposing sides;

and wherein the fixed wall includes a first portion facing the front of the module, a second portion facing one of the opposing sides of the module and a third portion facing the other opposing side of the module;

and further including at least one of a number of said pushing blocks positioned between each of said first, second and third portions of said fixed wall and corresponding front and opposing sides of said module.

5. The fixture for opening a sealed module according to claim 4 wherein said drive mechanism is connected between said first portion of said fixed wall and one of said at least one of a number of said pushing blocks, said drive mechanism configured to translate said one of said at least one of a number of said pushing blocks away from said first portion of said fixed wall toward said front of said module.

6. The fixture for opening a sealed module according to claim 4 wherein said drive mechanism is connected between said second portion of said fixed wall and one of said at least one of a number of said pushing blocks, said drive mechanism configured to translate said one of said at least one of a number of said pushing blocks away from said second portion of said fixed wall toward one of said opposing sides of said module.

7. The fixture for opening a sealed module according to claim 6 wherein said drive mechanism is connected between said third portion of said fixed wall and another one of said at least one of a number of said pushing blocks, said drive mechanism configured to translate said another one of a number of said at least one of said pushing blocks away from said third portion of said fixed wall toward the other of said opposing sides of said module.

8. The fixture for opening a sealed module according to claim 1 wherein the module has a front, a back and opposing sides;

and wherein the fixed wall includes a first portion facing the front of the module, a second portion facing one of the opposing sides of the module and a third portion facing the other opposing side of the module;

and further including:

a first drive mechanism connected between said first portion of said fixed wall and a first one of said at least one of a number of said pushing blocks, said first drive mechanism configured to translate said first one of said at least one of a number of said pushing blocks away from said first portion of said fixed wall toward said front of said module;

a second drive mechanism connected between said second portion of said fixed wall and a second one of said at least one of a number of said pushing blocks, said second drive mechanism configured to translate said second one of said at least one of a number of said pushing blocks away from said second portion of said fixed wall toward one of said opposing sides of said module; and a third drive mechanism connected between said third portion of said fixed wall and a third one of said at least one of a number of said pushing blocks, said third drive mechanism configured to translate said third one of said at least one of a number of said pushing blocks away from said third portion of said fixed wall toward the other of said opposing sides of said module.

* * * * *

UNITED STATES PATENT AND TRADEMARK OFFICE
CERTIFICATE OF CORRECTION

PATENT NO. : 6,497,026 B1
DATED : December 24, 2002
INVENTOR(S) : Traver et al.

It is certified that error appears in the above-identified patent and that said Letters Patent is hereby corrected as shown below:

<u>Column 6,</u>
Line 34, please delete "saw-can" and replace with -- saw can --.

Signed and Sealed this

Tenth Day of June, 2003

JAMES E. ROGAN
*Director of the United States Patent and Trademark Office*